United States Patent
Shimamoto et al.

(10) Patent No.: US 7,704,860 B2
(45) Date of Patent: Apr. 27, 2010

(54) NITRIDE-BASED SEMICONDUCTOR DEVICE AND METHOD FOR FABRICATING THE SAME

(75) Inventors: Toshitaka Shimamoto, Osaka (JP); Yasutoshi Kawaguchi, Osaka (JP); Yoshiaki Hasegawa, Shiga (JP); Akihiko Ishibashi, Osaka (JP); Isao Kidoguchi, Hyogo (JP); Toshiya Yokogawa, Nara (JP)

(73) Assignee: Panasonic Corporation, Kadoma (JP)

( * ) Notice: Subject to any disclaimer, the term of this patent is extended or adjusted under 35 U.S.C. 154(b) by 819 days.

(21) Appl. No.: 10/597,575

(22) PCT Filed: Nov. 15, 2005

(86) PCT No.: PCT/JP2005/020927

§ 371 (c)(1),
(2), (4) Date: Jul. 31, 2006

(87) PCT Pub. No.: WO2006/054543

PCT Pub. Date: May 26, 2006

(65) Prior Publication Data

US 2008/0272462 A1 Nov. 6, 2008

(51) Int. Cl.
*H01L 21/20* (2006.01)
(52) U.S. Cl. .................................. 438/481
(58) Field of Classification Search ............ 438/481
See application file for complete search history.

(56) References Cited

U.S. PATENT DOCUMENTS

| | | | |
|---|---|---|---|
| 5,042,043 A * | 8/1991 | Hatano et al. | 372/45.012 |
| 6,252,261 B1 | 6/2001 | Usui et al. | |
| 6,426,519 B1 * | 7/2002 | Asai et al. | 257/103 |
| 6,582,986 B2 * | 6/2003 | Kong et al. | 438/48 |
| 6,836,498 B2 | 12/2004 | Takeya et al. | |
| 6,940,103 B2 * | 9/2005 | Kiyoku et al. | 257/103 |

(Continued)

FOREIGN PATENT DOCUMENTS

JP    2001-158698    6/2001

(Continued)

OTHER PUBLICATIONS

International Search Report for corresponding Application No. PCT/JP2005/020927 mailed Jan. 26, 2006.

(Continued)

*Primary Examiner*—David Vu
*Assistant Examiner*—Brandon Fox
(74) *Attorney, Agent, or Firm*—Kenner, Otto, Boisselle & Sklar, LLLP

(57) ABSTRACT

A nitride-based semiconductor device according to the present invention includes a semiconductor multilayer structure supported on a substrate structure 101 with electrical conductivity. The principal surface of the substrate structure 101 has at least one vertical growth region, which functions as a seed crystal for growing a nitride-based semiconductor vertically, and a plurality of lateral growth regions for allowing the nitride-based semiconductor that has grown on the vertical growth region to grow laterally. The sum $\Sigma X$ of the respective sizes of the vertical growth regions as measured in the direction pointed by the arrow A and the sum $\Sigma Y$ of the respective sizes of the lateral growth regions as measured in the same direction satisfy the inequality $\Sigma X/\Sigma Y > 1.0$.

9 Claims, 13 Drawing Sheets

U.S. PATENT DOCUMENTS

| | | | |
|---|---|---|---|
| 7,052,979 B2 * | 5/2006 | Nagai et al. | 438/478 |
| 7,115,486 B2 * | 10/2006 | Tadatomo et al. | 438/481 |
| 2001/0003019 A1 | 6/2001 | Morita | |
| 2003/0141512 A1 | 7/2003 | Bruderl et al. | |
| 2003/0143771 A1 | 7/2003 | Kidoguchi et al. | |
| 2004/0079960 A1 * | 4/2004 | Shakuda | 257/103 |
| 2006/0078024 A1 * | 4/2006 | Matsumura et al. | 372/46.01 |

FOREIGN PATENT DOCUMENTS

| | | |
|---|---|---|
| JP | 2001-308464 | 11/2001 |
| JP | 2002-009004 | 1/2002 |
| JP | 2002-076518 | 3/2002 |
| JP | 2002-237656 | 8/2002 |
| JP | 2003-086905 | 3/2003 |
| JP | 2003-158295 | 5/2003 |
| JP | 2003-234505 | 8/2003 |
| JP | 2003-300800 | 10/2003 |

OTHER PUBLICATIONS

Nagahama et al.; "High-Power and Long-Lifetime InGaN Multi-Quantum-Well Laser Diodes Grown on Low-Dislocation-Density GaN Substrates", Japanese Journal of Applied Physics vol. 39, pp. L647-650, 2000. (Cited in [0013] on p. 6 of the description).

International Searching Authority's Written Opinion with partial English translation.

* cited by examiner

US 7,704,860 B2

NITRIDE-BASED SEMICONDUCTOR DEVICE AND METHOD FOR FABRICATING THE SAME

TECHNICAL FIELD

The present invention relates to a nitride-based semiconductor device such as a semiconductor laser that can be used in the fields of optical information processing and displays and also relates to a method for fabricating such a device.

BACKGROUND ART

A violet semiconductor laser, made of Group III-V nitride semiconductors ($Al_xGa_yIn_{1-x-y}N$ (where $0 \leq x \leq 1$ and $0 \leq y \leq 1$) such as gallium nitride (GaN), is a key device for realizing ultrahigh density recording by optical disk drives, and is about to be actually used in consumer electronics products. The output of a violet semiconductor laser must be increased not just to enable high-speed writing on an optical disk but also to develop new fields of technology including application to laser displays. A conventional violet semiconductor laser is disclosed in Non-Patent Document No. 1, for example.

Recently, a GaN wafer has been regarded as a strong candidate for a wafer for fabricating a nitride-based semiconductor device thereon. This is because a GaN wafer is superior in the degree of crystal lattice matching and heat dissipation ability to a sapphire wafer that has been used in the pertinent art. Another advantage is that the GaN wafer has electrical conductivity, whereas the sapphire wafer is an insulator. That is to say, a structure in which current also flows across a GaN substrate can be adopted by arranging an additional electrode on the back surface of the GaN substrate, too. If an electrode is arranged on the back surface of a GaN substrate with electrical conductivity, then the size (i.e., the chip area) of each semiconductor device can be reduced, thus increasing the number of chips that can be made out of a single wafer. As a result, the manufacturing cost can be reduced.

A GaN wafer may be made in the following manner, for example. First, a GaN single-layer film is grown on a sapphire wafer by an MOVPE process. Thereafter, a thick GaN film is grown on the GaN single-layer film by a hydride VPE (HVPE) process, for example. And then the sapphire wafer is removed.

A GaN wafer obtained in this manner has dislocations (including edge dislocations, spiral dislocations and mixed dislocations) at a density of about $5 \times 10^7$ cm$^{-2}$. If the dislocation density is that high, it is difficult to make highly reliable semiconductor lasers. In addition, the uppermost surface of a GaN wafer made by an HVPE or any other process may have pits, hillocks and so on, and therefore, may sometimes have an unevenness of about 0.1 mm. Such unevenness on the principal surface of a GaN wafer will pose a big obstacle to a photolithographic process, for example, thus decreasing the production yield of devices.

To iron out such unevenness on the principal surface of a wafer, the principal surface of a wafer needs to be polished and planarized. Since GaN is highly resistant to chemicals, it is difficult to planarize the GaN wafer by chemical polishing, and therefore, mechanical polishing is usually adopted. In that case, however, the surface of the GaN wafer often gets scratched and damages are often left in the vicinity of the surfaces of crystals.

Besides, machining strains (residual strains) are often left on the surface of the wafer and have an in-plane distribution in many cases. When observed using an atomic force microscope (AFM), the scratched had a depth of several tens of μm and the root mean square (RMS), calculated on an area of 50 μm square, was 1.6 nm. If GaN crystals were grown as they are on the principal surface of such a GaN wafer, then the surfaces of crystals would be seriously affected by those scratches.

To make the density of dislocations in the nitride-based semiconductor layer that has been grown on a GaN wafer lower than that of the GaN wafer, an epitaxial lateral overgrowth (ELO) has been adopted. Hereinafter, the epitaxial lateral overgrowth will be described with reference to FIGS. 12(a) through 12(d).

First, as shown in FIG. 12(a), a GaN wafer 1001 is provided and a mask layer 1003 of $SiO_2$ is formed thereon. The mask layer 1003 has striped openings that selectively expose regions of the principal surface of the wafer that will function as a seed for crystal growth.

Next, as shown in FIG. 12(b), an epitaxial lateral overgrowth process is carried out as an MOVPE process, thereby growing an n-GaN layer 1002 from the respective openings of the mask layer 1003. In this process step, conditions for growing GaN crystals less easily on the mask layer 1003 are adopted. However, polycrystalline GaN sometimes precipitates on the mask layer 1003, too. The GaN wafer 1001 often has n-type conductivity. Thus, by supplying not only a source gas of gallium nitride but also monosilane ($SiH_4$) and disilane ($Si_2H_6$) onto the GaN wafer, a GaN layer 1002 having n-type conductivity is formed.

If the n-GaN layer 1002 continues to be grown as shown in FIG. 12(c), then adjacent portions of the n-GaN layer 1002 will soon be combined with each other, thus forming a single continuous layer as shown in FIG. 12(d).

The n-GaN layer 1002 formed by such a process has regions where the density of dislocations is reduced to $7 \times 10^5$ cm$^{-2}$ or less. If the device structure is fabricated over such regions with a reduced density of dislocations, then the reliability can be increased. However, if polycrystalline GaN precipitates on the mask layer 1003 as shown in FIG. 12(b), then crystallinity deteriorated regions 1004 will be produced as shown in FIG. 12(c).

To further reduce the density of dislocations, Patent Document No. 1 discloses a semiconductor device in which a mask layer is formed in striped recesses and an air gap is provided over the mask layer. FIG. 13 illustrates a structure including an n-GaN wafer 101 in which recesses are covered with a mask layer 103 and an n-GaN layer 103 that has grown from striped ridges. The n-GaN layer 103 includes low-dislocation regions 104 with a relatively low density of dislocations and high-dislocation regions 105 with a relatively high density of dislocations. A ridge stripe 106, defining a current injection region, for example, is arranged on a low-dislocation region 104 on the n-GaN layer 102.

Non-Patent Document No. 1: Japanese Journal of Applied Physics (Jpn. J. Appl. Phys.), Vol. 39. p. L647, 2000

Patent Document No. 1: Japanese Patent Application Laid-Open Publication No. 2002-9004

DISCLOSURE OF INVENTION

Problems to be Solved by the Invention

The semiconductor laser disclosed in Patent Document No. 1 can minimize the deterioration of crystallinity due to the polycrystalline GaN that has precipitated on the mask layer. However, the present inventors discovered that if a structure including an electrode on the back surface of a GaN substrate was adopted, the desired laser oscillation could not be realized easily as in the situation where the structure formed by the method shown in FIG. 12 was adopted unless the voltage applied between the electrodes was increased.

In order to overcome the problems described above, a primary object of the present invention is to provide a highly reliable nitride-based semiconductor device at a good yield.

Means for Solving the Problems

A nitride-based semiconductor device according to the present invention includes a substrate structure with electrical conductivity and a semiconductor multilayer structure that is supported on the substrate structure. The principal surface of the substrate structure has at least one vertical growth region, which functions as a seed crystal for growing a nitride-based semiconductor vertically, and a plurality of lateral growth regions for allowing the nitride-based semiconductor that has grown on the vertical growth region to grow laterally. The sum $\Sigma X$ of the respective sizes of the vertical growth regions as measured in a first direction, which is parallel to the principal surface of the substrate structure, and the sum $\Sigma Y$ of the respective sizes of the lateral growth regions as measured in the first direction satisfy the inequality $\Sigma X/\Sigma Y > 1.0$.

In one preferred embodiment, the substrate structure is made of $Al_{x1}Ga_{y1}In_{z1}N$ crystals (where $x1+y1+z1=1$, $x1 \geq 0$, $y1 \geq 0$ and $z1 \geq 0$), and the semiconductor multilayer structure includes an $Al_{x2}Ga_{y2}In_{z2}N$ crystal layer (where $x2+y2+z2=1$, $x2 \geq 0$, $y2 \geq 0$ and $z2 \geq 0$) that has grown from the vertical growth region on the principal surface of the substrate structure.

In another preferred embodiment, the substrate structure includes: a substrate body made of $Al_{x1}Ga_{y1}In_{z1}N$ crystals (where $x1+y1+z1=1$, $x1 >= 0$, $y1 \geq 0$ and $z1 > 0$); and an $Al_{x3}Ga_{y3}In_{z3}N$ crystal layer (where $x3+y3+z3=1$, $x3 \geq 0$, $y3 \geq 0$ and $z3 > 0$), which has been formed on the upper surface of the substrate body and of which the surface functions as the principal surface of the substrate structure. And the semiconductor multilayer structure includes an $Al_{x2}Ga_{y2}In_{z2}N$ crystal layer (where $x2+y2+z2=1$, $x2 \geq 0$, $y2 \geq 0$ and $z2 \geq 0$) that has grown from the vertical growth region on the principal surface of the substrate structure.

In still another preferred embodiment, the vertical and lateral growth regions on the principal surface of the substrate structure extend in stripes perpendicularly to the first direction.

In this particular preferred embodiment, the vertical growth region on the principal surface of the substrate structure is defined by a striped ridge portion that is present on the principal surface of the substrate structure.

Alternatively or additionally, the nitride-based semiconductor device further includes a mask layer that covers the principal surface of the substrate structure. The mask layer includes at least one striped opening, which is aligned with the vertical growth regions, and masking portions, which are aligned with the lateral growth regions.

In a specific preferred embodiment, the area of the opening of the mask layer is greater than the overall area of the masking portions of the mask layer.

In still another preferred embodiment, the semiconductor multilayer structure includes an active layer, of which the bandgap is smaller than that of the $Al_{x2}Ga_{y2}In_{z2}N$ crystal layer. The device further includes a current confining structure for injecting carriers into a part of the active layer.

In this particular preferred embodiment, the current confining structure is located right over the lateral growth regions on the principal surface of the substrate structure.

In yet another preferred embodiment, the $Al_{x3}Ga_{y3}In_{z3}N$ layer has a structure in which at least one of the mole fractions x3, y3 and z3 of its constituents changes in the thickness direction thereof.

In a specific preferred embodiment, the $Al_{x3}Ga_{y3}In_{z3}N$ includes at least two layers.

A method for fabricating a nitride-based semiconductor device according to the present invention includes the steps of: (A) providing a substrate structure, which has, on its principal surface, a plurality of vertical growth regions functioning as a seed crystal for growing a nitride-based semiconductor vertically and a plurality of lateral growth regions for allowing the nitride-based semiconductor that has grown on the vertical growth regions to grow laterally, the substrate structure satisfying the inequality $X/Y > 1.0$, where X is the size of each said vertical growth region as measured in a first direction, which is parallel to the principal surface of the substrate structure, and Y is the size of each said lateral growth region as measured in the first direction; and (B) growing a nitride-based semiconductor layer on the principal surface of the substrate structure.

In one preferred embodiment, the step (A) includes the step of providing a wafer made of $Al_{x1}Ga_{y1}In_{z1}N$ crystals (where $x1+y1+z1=1$, $x1 >= 0$, $y1 \geq 0$ and $z1 \geq 0$) as the substrate structure, and the step (B) includes the step of growing an $Al_{x2}Ga_{y2}In_{z2}N$ crystal layer (where $x2+y2+z2=1$, $x2 \geq 0$, $y2 \geq 0$ and $z2 \geq 0$), functioning as the nitride-based semiconductor layer, from the vertical growth regions on the principal surface of the substrate structure.

In another preferred embodiment, the step (A) includes the steps of: (a1) providing a wafer made of $Al_{x1}Ga_{y1}In_{z1}N$ crystals (where $x1+y1+z1=1$, $x1 \geq 0$, $y1 \geq 0$ and $z1 \geq 0$) as a substrate body; and (a2) growing an $Al_{x3}Ga_{y3}In_{z3}N$ crystal layer (where $x3+y3+z3=1$, $x3 \geq 0$, $y3 \geq 0$ and $z3 \geq 0$), of which the surface functions as the principal surface of the substrate structure, on the upper surface of the substrate body. The step (B) includes growing an $Al_{x2}Ga_{y2}In_{z2}N$ crystal layer (where $x2+y2+z2=1$, $x2 \geq 0$, $y2 \geq 0$ and $z2 \geq 0$), functioning as the nitride-based semiconductor layer, from the vertical growth regions on the principal surface of the substrate structure.

In still another preferred embodiment, the vertical and lateral growth regions on the principal surface of the substrate structure extend in stripes perpendicularly to the first direction.

In this particular preferred embodiment, the vertical growth regions on the principal surface of the substrate structure are defined by striped ridge portions that are present on the principal surface of the substrate structure.

In a specific preferred embodiment, the step (A) includes the steps of: covering the principal surface of the substrate structure with a resist mask that has a pattern defining the vertical growth regions; and selectively etching away exposed portions of the principal surface of the substrate structure that are not covered with the resist mask.

Alternatively or additionally, the device further includes a mask layer that covers the principal surface of the substrate structure. The mask layer includes striped openings, which are aligned with the vertical growth regions, and masking portions, which are aligned with the lateral growth regions.

In this particular preferred embodiment, the overall area of the openings of the mask layer is greater than that of the masking portions of the mask layer.

In yet another preferred embodiment, the method further includes the step (C) of forming a semiconductor multilayer structure including the nitride-based semiconductor layer and other semiconductor layers that have been stacked on the nitride-based semiconductor layer. The step (C) includes the steps of (c1) forming an active layer, of which the bandgap is smaller than that of the $Al_{x2}Ga_{y2}In_{z2}N$ crystal layer, and (c2) forming a current confining structure for injecting carriers into a part of the active layer.

In this particular preferred embodiment, the step (c2) includes the step of arranging the current confining structure right over the lateral growth regions on the principal surface of the substrate structure.

In yet another preferred embodiment, the step (a2) includes the step of changing at least one of the mole fractions x3, y3 and z3 of the constituents of the $Al_{x3}Ga_{y3}In_{z3}N$ layer in the thickness direction thereof.

In a specific preferred embodiment, the $Al_{x3}Ga_{y3}In_{z3}N$ layer includes at least two layers.

In yet another preferred embodiment, the step (a2) includes the step of changing growth temperatures while the $Al_{x3}Ga_{y3}In_{z3}N$ layer is growing.

In yet another preferred embodiment, at least one of X and Y changes from one position to another on the principal surface of the substrate structure as a wafer.

Effects of the Invention

According to the present invention, electrical resistance to a current flowing across the principal surface of a substrate can be reduced, thus increasing the reliability and production yield of a nitride-based semiconductor device to be fabricated by an epitaxial lateral overgrowth process.

Figure 1:
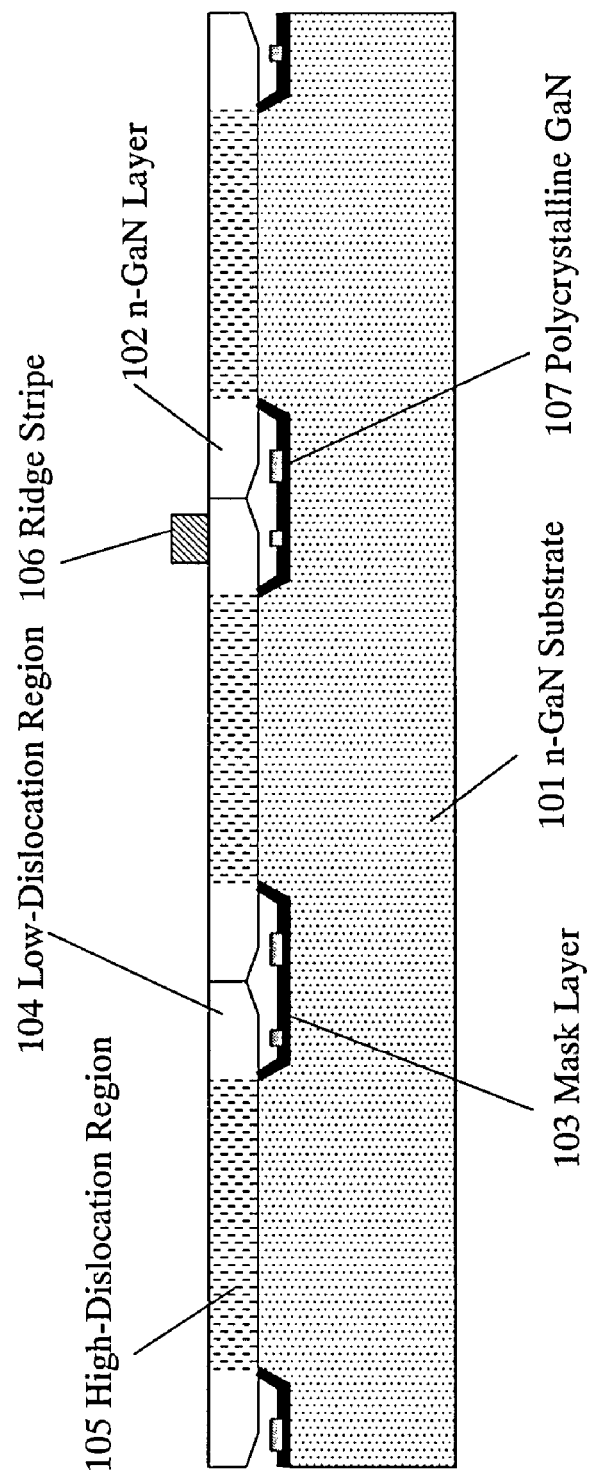
FIG. 1 is a cross-sectional view illustrating a first preferred embodiment of a nitride-based semiconductor device according to the present invention.

DESCRIPTION OF REFERENCE NUMERALS 101 n-GaN substrate
102 n-GaN layer
103 $SiN_x$
104 low-dislocation region
105 high-dislocation region
106 position of ridge stripe
107 polycrystalline GaN
201 n-AlGaN/GaN superlattice contact layer
202 n-AlGaN/GaN superlattice cladding layer
203 n-GaN optical guide layer
204 MQW active layer
205 p-GaN optical guide layer
206 p-AlGaN/GaN superlattice cladding layer
207 p-GaN contact layer
208 p-electrode
209 insulating film ($SiO_2$)
210 n-electrode
211 void (combined portion)
601 n-AlGaN/GaN superlattice contact layer
602 n-AlGaN/GaN superlattice cladding layer
603 n-GaN optical guide layer
604 MQW active layer
605 p-GaN optical guide layer
606 p-AlGaN/GaN superlattice cladding layer
607 p-GaN contact layer
608 p-electrode
609 insulating film ($SiO_2$)
610 n-electrode
801 (AlIn)GaN layer
1001 n-GaN substrate structure
1002 n-GaN layer
1003 $SiO_2$
1004 crystallinity deteriorated region
1007 polycrystalline GaN
1101 low-temperature (AlIn)GaN layer
1102 high-temperature (AlIn)GaN layer
1201 (AlIn)GaN layer with low carrier density
1202 (AlIn)GaN layer with high carrier density
1203 n-GaN layer (low-carrier-density layer)
1204 n-GaN layer (high-carrier-density layer)

BEST MODE FOR CARRYING OUT THE INVENTION

Hereinafter, preferred embodiments of a nitride-based semiconductor device according to the present invention will be described with reference to the accompanying drawings.

In the preferred embodiments to be described below, a nitride-based semiconductor is supposed to be grown by an MOVPE process. However, crystal growing processes that can be used in the present invention include not only MOVPE but also hydride vapor phase epitaxy (H-VPE) process, molecular beam epitaxy (MBE) process and other known methods for growing a nitride-based semiconductor.

Embodiment 1

First, referring to FIG. 1, illustrated schematically is a cross section of a nitride-based semiconductor device according to a first specific preferred embodiment of the present invention.

The semiconductor device shown in FIG. 1 includes a GaN substrate 101 including multiple striped ridges on the principal surface thereof and an n-GaN layer 102 that has grown on the GaN substrate 101. In an actual semiconductor device, a number of nitride-based semiconductor layers are usually stacked one upon the other on the n-GaN layer 102. However, if the n-GaN layer 102 shown in FIG. 1 is used as a channel layer for transistors, a gate insulating film, an interconnect structure and so on are formed on the n-GaN layer 102.

Figure 2:
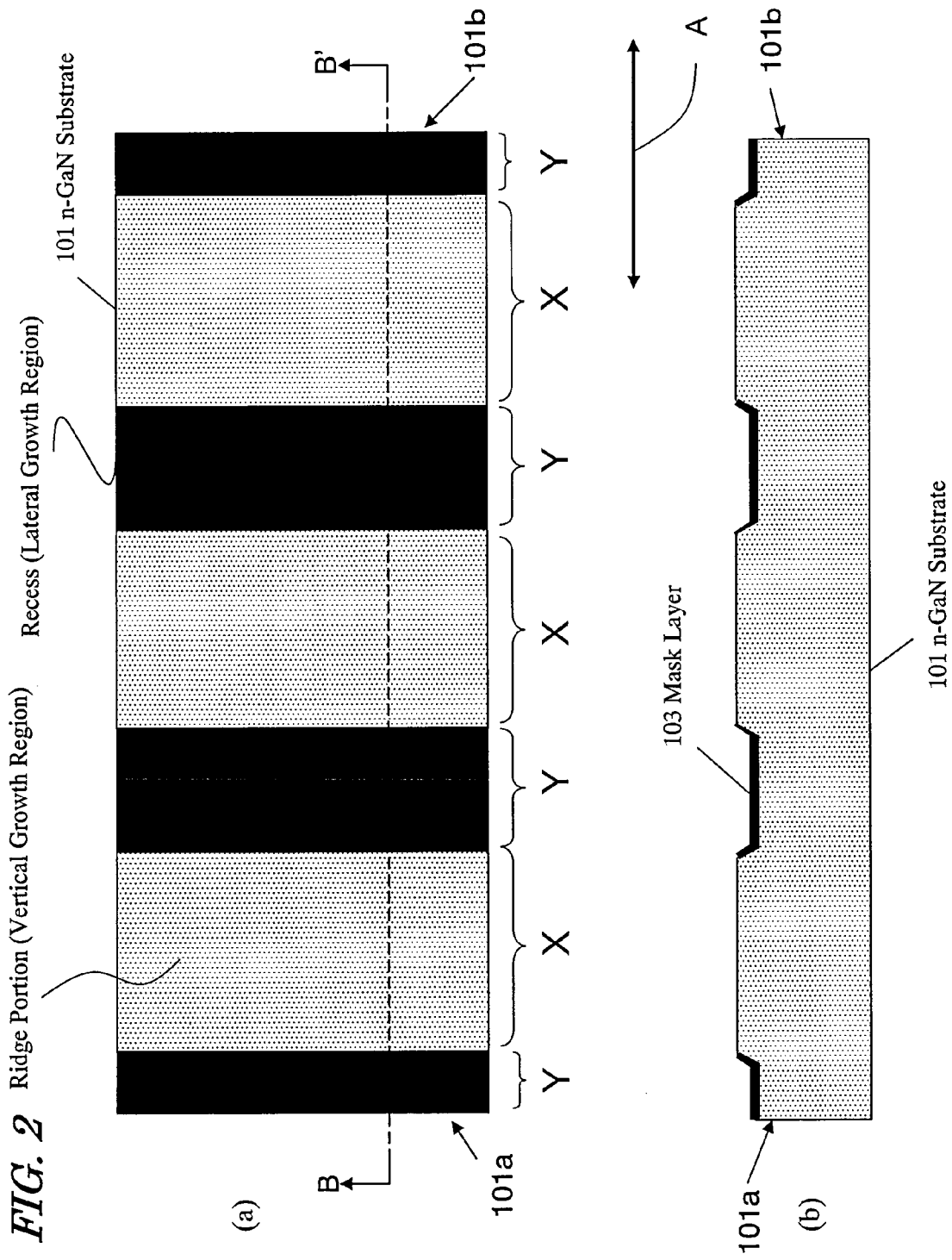
FIGS. 2(a) and 2(b) are respectively a plan view illustrating the n-GaN substrate 101 of the semiconductor device shown in FIG. 1 and a cross-sectional view as viewed on the plane B-B'.

The configuration of the GaN substrate 101 will be described in further detail with reference to FIG. 2. Specifically, FIG. 2(a) is a top view illustrating the principal surface of the GaN substrate 101 of a nitride-based semiconductor device and FIG. 2(b) is a cross-sectional view thereof as viewed on the plane B-B'. As shown in FIG. 2, the respective upper surfaces of the ridge portions that have been formed on the principal surface of the GaN substrate 101 are "vertical growth regions" functioning as a seed crystal for growing a nitride-based semiconductor vertically. On the other hand, the recesses are "lateral growth regions" that allow the nitride-based semiconductor, which has grown from the respective upper surfaces of the ridge portions (i.e., the vertical growth regions), to grow laterally. In this preferred embodiment, the vertical growth regions and the lateral growth regions are arranged alternately and periodically parallel to the principal surface of the substrate as pointed by the arrow A (i.e., in the first direction) in FIG. 2(a). The ends 101a and 101b of the GaN substrate 101 are faces that are exposed by cutting or cleaving a GaN wafer. Even if those "vertical growth regions" and "lateral growth regions" of the same size are arranged periodically on a single GaN wafer, the size of the "vertical growth region" or "lateral growth region" located at the end 101a or 101b of the GaN substrate 101 is usually smaller than that of the other "vertical growth regions" or "lateral growth regions" that are not located at the ends 101a and 10b of the GaN substrate 101 when the GaN wafer is divided into multiple chip substrates.

Suppose the size of each of those vertical growth regions as measured in the direction pointed by arrow A (i.e., in the first direction) is X and the size of each of those lateral growth regions as measured in the first direction is Y. Also, the sum of the respective sizes of the vertical growth regions included in a single semiconductor device is represented by $\Sigma x$ and the sum of the respective sizes of the lateral growth regions included in a single semiconductor device is represented by $\Sigma y$. In that case, the principal surface of the n-GaN substrate 101 has been patterned in this preferred embodiment so as to satisfy the inequality $\Sigma X/\Sigma Y>1.0$. In this preferred embodiment, the vertical growth regions and the lateral growth regions extend in stripes perpendicularly to the first direction (i.e., in a second direction). That is why the size measured in the direction pointed by the arrow A (i.e., in the first direction) will sometimes be referred to herein as the "width".

The raised and recessed structure on the principal surface of the n-GaN substrate 101 shown in FIG. 2 can be formed by known photolithography and etching techniques. In this preferred embodiment, first, an n-GaN wafer 101 with a substantially flat surface is provided and the principal surface of the n-GaN wafer 101 is covered with a resist layer. Next, the resist layer is subjected to an exposure process using a photomask with a striped pattern, and then developed, thereby defining a resist mask (not shown) that has striped openings. Thereafter, exposed portions of the principal surface of the n-GaN wafer 101, which are not covered with the resist mask, are selectively etched away, thereby forming the recesses shown in FIG. 2 on the principal surface of the n-GaN wafer 101. After that, the resist mask is removed.

In this preferred embodiment, the principal surface of the n-GaN substrate 101 is a (0001) plane. Also, in this preferred embodiment, the pattern of the resist mask is defined such that the width Y of the recesses (i.e., the size measured in the first direction) becomes approximately equal to 10 μm and that the width of the ridges (i.e., the size measured in the first direction) becomes approximately equal to 7 μm.

After the resist mask has been stripped, an $SiN_x$ layer is deposited over the entire surface of the wafer by a plasma CVD process. Thereafter, a resist is deposited for planarization purposes on the wafer 101 covered with the $SiN_x$ layer. Subsequently, the resist and $SiN_x$ layer are etched back until the top of the n-GaN wafer 101 (i.e., the upper surface of the ridge portions) is exposed, thereby forming a mask layer 103 of the $SiN_x$ layer only in the recesses. After that, the remaining resist is removed with an organic solvent, for example.

According to this method, only the recesses on the principal surface of the substrate can be selectively covered with the mask layer 103, and the upper surface of the exposed ridge portions functions as a seed for crystal growth. This mask layer 103 will function as a selective growth mask in the process step of selectively growing a nitride-based semiconductor laterally as will be described later. That is why the mask layer 103 is preferably made of a material that does not allow the nitride-based semiconductor to grow easily on its surface.

Next, the n-GaN wafer 101 having the structure shown in FIG. 2 is loaded into the growth chamber of an MOVPE system to grow an n-type GaN layer 102 on the upper surface of the ridge portions (i.e., from seed portions) at 1,050° C. by an MOVPE process. In this preferred embodiment, $SiH_4$ is used as an n-type dopant. The GaN layer 102 grows not only vertically on the ridge portions (i.e., perpendicularly to the principal surface of the substrate) but also parallel to the principal surface of the wafer (i.e., laterally). In this manner, the GaN layer 102 expands toward, and reaches over, the recesses where the mask layer 103 is embedded.

As a result of this selective growth, the GaN crystals that have grown from the upper surface of each ridge portion is combined with the GaN crystals that have grown from the upper surface of its adjacent ridge portion, thereby forming a single n-GaN layer 102 eventually.

As shown in FIG. 1, the n-GaN substrate 101, of which the principal surface is already covered with the n-GaN layer 102, has a plurality of air gaps between the recesses on the principal surface of the substrate and the n-GaN layer 102. Those air gaps are arranged in stripes in the direction in which the striped ridge portions extend.

As described above, the respective GaN crystals that have grown from those ridge portions are combined with each other substantially at the center of the air gaps. It should be noted that the growth rates of the n-GaN crystals in the a-axis direction (in the lateral direction) and in the c-axis direction (in the vertical direction) are controllable by adjusting the concentration of a dopant to be introduced into the GaN crystals.

As shown in FIG. 1, the n-GaN layer 102 includes low-dislocation regions 104 having a relatively low density of dislocations and high-dislocation regions 105 having a relatively high density of dislocations. The high-dislocation regions 105 are located on the ridge portions on the principal surface of the substrate, while the low-dislocation regions 104 are located over the air gaps. In some of the air gaps, polycrystalline GaN 107 may have grown on the mask layer 103. When the selective growth process is carried out to form the n-GaN layer 102, conditions to limit the growth of nitride semiconductor crystals on the mask layer 103 are adopted but the polycrystalline GaN 107 may still be produced partially. If the growth rate of the polycrystalline GaN 107 is low or if the recesses on the principal surface of the substrate are sufficiently deep, then the formation of the n-GaN layer 102 is not interfered with by the polycrystalline GaN 107.

In the example illustrated in FIG. 1, a ridge stripe 106 is arranged on a low-dislocation region 104 of the n-GaN layer 102. The ridge stripe 106 has as low a density of dislocations as the underlying low-dislocation region 104 and is a semiconductor region with excellent crystallinity. Therefore, the ridge stripe 106 is used as the active region of a semiconductor device, which needs to have a particularly high degree of crystallinity.

Hereinafter, it will be described in further detail with reference to FIGS. 3(a) through 3(d) how the n-GaN layer 102 grows. In FIGS. 3(a) through 3(d), only a portion of a wafer, which will eventually be used in the semiconductor device shown in FIG. 1, is illustrated.

Figure 3:
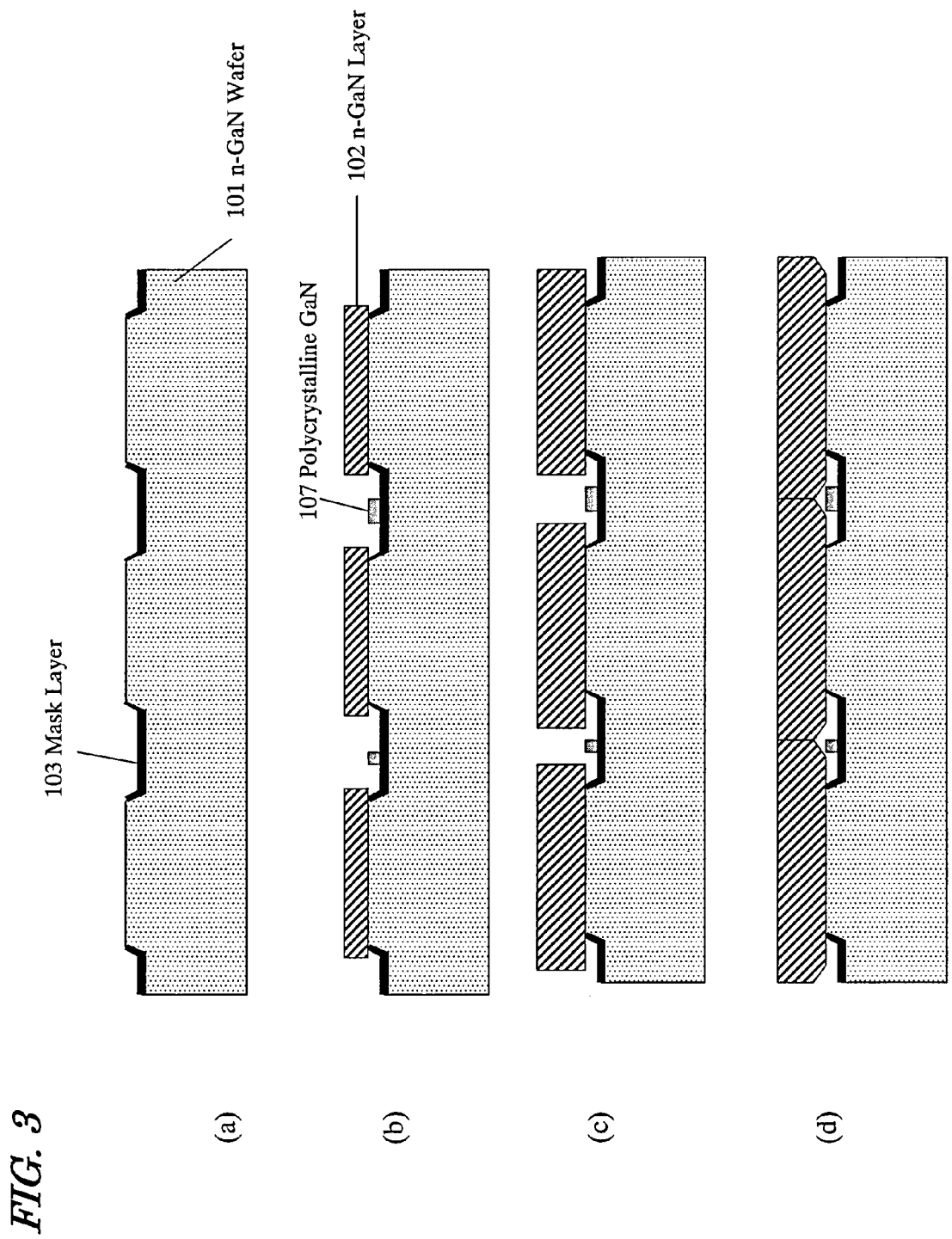
FIGS. 3(a) through 3(d) are cross-sectional views illustrating respective process steps for growing the n-GaN layer 102 shown in FIG. 1.

First, as shown in FIG. 3(a), an n-GaN wafer 101, of which the principal surface has recesses and in which the bottom and side surface of the recesses are covered with a mask layer 103, is provided and loaded into the chamber of an MOVPE system. The n-GaN wafer 101 shown in FIG. 3(a) corresponds to the n-GaN substrate 101 shown in FIG. 2(a).

Thereafter, the principal surface of the n-GaN wafer 101 is subjected to a heat treatment process at a temperature of about 500° C. to about 1,100° C. (i.e., thermal cleaning). This heat treatment process may be carried out at 750° C. for at least one minute, preferably five minutes or more. During this heat treatment process, a gas including nitrogen (N) atoms such as $N_2$, $NH_3$ or hydrazine gas is preferably supplied into the chamber.

After the heat treatment process, an n-GaN layer 102 is selectively grown on the ridge portions at a temperature of about 1,050° C. by an MOVPE process. FIG. 3(b) shows the n-GaN layer 102 growing. At this point in time, the n-GaN crystals that have grown on the respective ridge portions still have a striped shape and have not been combined together to form a single layer. Subsequently, if the n-GaN crystals are further grown as shown in FIG. 3(c), then a single continuous n-GaN layer 102 can soon be formed as shown in FIG. 3(d).

In this manner, if n-GaN crystals 102 are grown on the n-GaN wafer 101, including ridge portions or recesses as shown in FIG. 3(a), by an MOVPE process, then GaN will not grow epitaxially on the regions that are covered with the mask layer 103 but will be selectively grown epitaxially on the ridge portions (seed portions) of the n-GaN wafer 101, which are exposed through the openings of the mask layer 13. Each of the crystallographic planes functioning as the seed portions is a (0001) plane just like the principal surface of the wafer and may be formed in a striped shape with a width of about 7 μm.

When the n-GaN crystals are selectively grown laterally in this manner, the polycrystalline GaN 107 is sometimes crystallized on the mask layer 103 in the recesses as shown in FIG. 3(b). Particularly if droplets of Ga or GaN have been deposited on the mask layer 103 in the recesses as a result of the heat treatment process (i.e., thermal cleaning) to be carried out before the crystals are formed, then the polycrystalline Ga 107 can grow easily on the mask layer 103 from those droplets. However, the polycrystalline GaN 107 that has grown on the mask layer 103 has a smaller height than the ridge portions, and therefore, does not affect the crystallinity of the n-GaN crystals 102 that has grown laterally from the upper surface of the ridge portions. From this viewpoint, the recesses preferably have a depth of at least 500 nm.

A currently available n-GaN wafer 101 has a density of dislocations of about $5 \times 10^6$ $cm^{-2}$. However, in a laterally grown portion of the n-GaN layer 102, the density of dislocations can be lower than that of the wafer by at least one order of magnitude. As a result, the reliability of the resultant semiconductor device can be increased significantly. In addition, by performing the process steps shown in FIGS. 3(a) through 3(d), the unwanted effects that would be caused by the scratches on the principal surface of the n-GaN wafer 101 can be reduced, too. The principal surface of the n-GaN wafer 101 usually has a lot of scratches (with a depth of approximately several tens of nm) that have been made here and there as a result of a polishing process. That is why if GaN crystals were grown on the principal surface of the n-GaN wafer 101 as it is, then the resultant GaN crystal layer would have a noticeably waving surface due to the influence of those scratches. However, if those striped recesses (to be the air gaps) are made on the GaN wafer 101 as is done in this preferred embodiment, then GaN crystals grown on those recesses will not be affected by the scratches. Although the ridge portions are easily affected by the unevenness on the principal surface of the wafer, the laterally grown portions are hardly affected by that unevenness. Due to these effects, the method shown in FIGS. 3(a) through 3(d) can increase the degree of planarity of the surface of the GaN crystals greatly.

As described above, according to this preferred embodiment, $\Sigma X / \Sigma Y$ is preferably set to be at least greater than 1.0, more preferably greater than 2.0, and even more preferably greater than 3. The effects achieved by this setting will be described.

First, referring to FIGS. 4(a) through 4(c), shown are a curve representing a correlation between the width X of the seed portion and the voltage and curves representing correlations between $\Sigma X / \Sigma Y$ and the voltage. The differences between the curves shown in FIGS. 4(b) and 4(c) lie in the scale and the range of the axis of abscissas.

Figure 4:
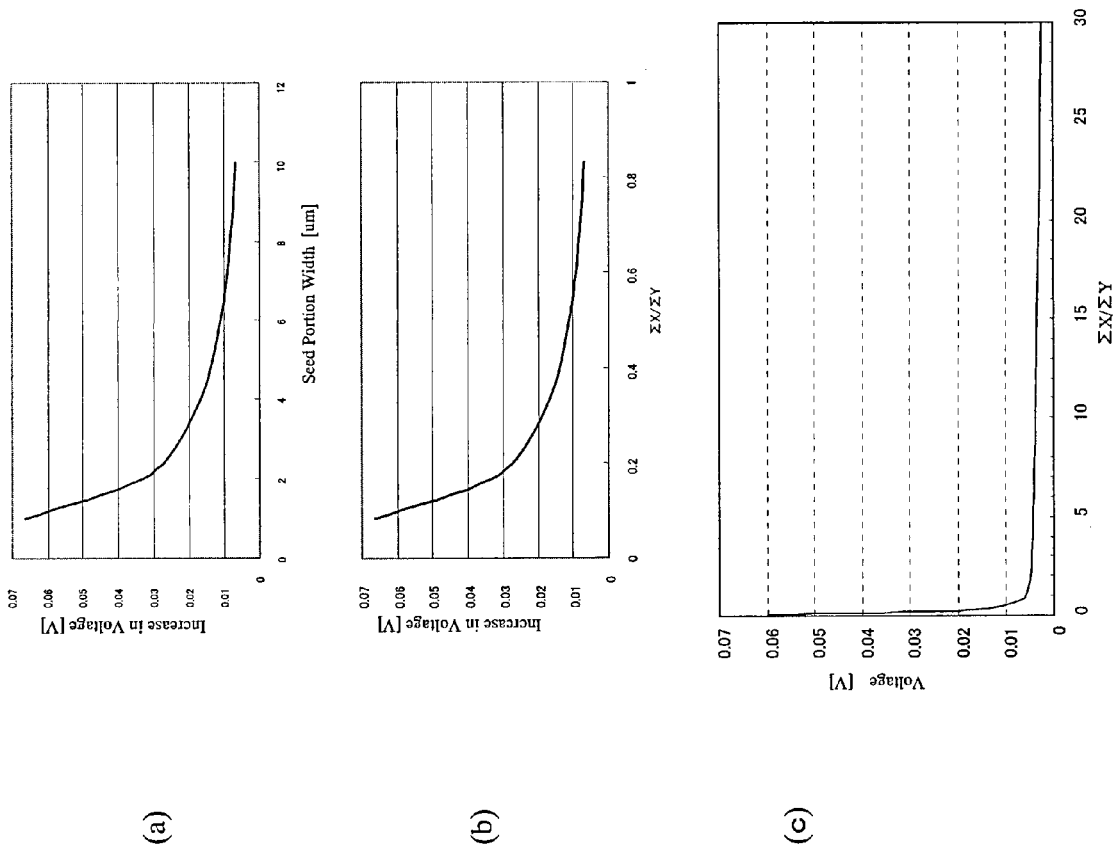
FIG. 4(a) is a graph showing a correlation between the width X of seed portions and the voltage.
FIGS. 4(b) and 4(c) are graphs each showing a correlation between ΣX/ΣY and the voltage.

As can be seen from FIG. 4, if the width X of each of the crystal growth seed portions (i.e., the vertical growth regions) is increased and the width Y of each of the recesses (i.e., the lateral growth regions) is decreased on the principal surface of the n-GaN substrate 101, then the voltage to be applied to produce the same amount of current can be reduced. This is because as $\Sigma X / \Sigma Y$ is increased, the overall area of the regions where the current can flow vertically increases on the principal surface of the substrate. The larger the area of a current flowing region, the lower the resistance. As a result, the voltage to be applied to produce the same amount of current between the electrodes can be reduced.

Figure 5:
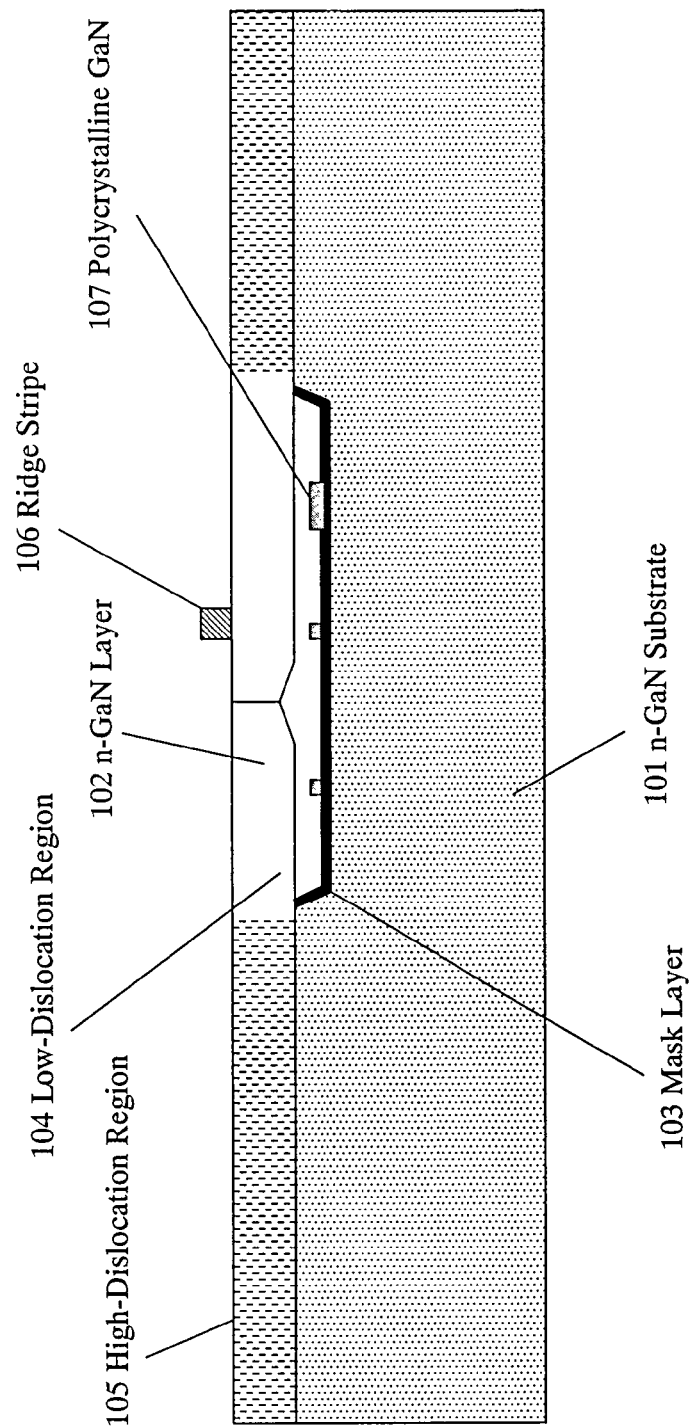
FIG. 5 is a cross-sectional view illustrating a modified example of the semiconductor device shown in FIG. 1.

Suppose the operating current of a semiconductor laser is defined at 100 mA, for example. In that case, to reduce the increase in voltage due to the resistance of the principal surface of the substrate to 0.01 V or less, the seed portion may have a width of 6 μm or more. And if this voltage increase is equal to or smaller than 0.01 V, the decrease in the reliability of the semiconductor laser can be avoided. It should be noted that each of the lateral growth portions of the n-GaN layer 102 preferably has a width (which will be referred to herein as a "wing width") of at least 6 μm. Accordingly, if the lateral growth portion should have a horizontally symmetrical shape, the recess preferably has a width Y of about 12 μm. However, if the asymmetrical lateral growth process is carried out as shown in FIG. 5, the width of one of the two lateral growth portions can be expanded effectively. As a result, the width of the recess can be reduced without reducing the wing width.

It should be noted that to reduce the electrical resistance, the number of air gaps (i.e., recesses) between the n-GaN substrate 101 and the n-GaN layer 102 is preferably as small as possible. That is why the air gaps are preferably created only right under the regions where the density of dislocations needs to be decreased (i.e., current confining structure). If one air gap is provided for a single semiconductor laser in this manner, then ΣX/ΣY will have a large value that is greater than 1.0 but equal to or smaller than 30. The present inventors discovered and confirmed via experiments that ΣX/ΣY is preferably at least equal to 2 and more preferably 3 or more. If a single lateral growth region is defined in a single substrate for one semiconductor device and is sandwiched between two vertical growth regions on the right- and left-hand sides thereof, then ΣX/ΣY can be set to be at least equal to 6 (e.g., 9 or more). This is beneficial because the greater ΣX/ΣY, the lower the applied voltage can be as can be seen from FIG. 4(c).

On the surface of a GaN wafer, there are a number of scratches as described above. Thus, it was commonly believed in the art that the size X of the vertical growth regions be minimized. It was also believed that as crystal regions that have grown on the vertical growth regions have a relatively low degree of crystallinity, the greater their size X, the more badly the crystal regions grown on the lateral growth regions are affected. However, the present inventors discovered and confirmed via experiments that even if the size X of the vertical growth regions was increased, the degree of crystallinity of the crystal regions grown on the lateral growth regions did not deteriorate. This is probably because since the GaN wafer 101, of which the material is homogeneous with that of the n-GaN layer 102, is used, almost no stress (or strain) should be caused between them. That is to say, even if the lateral growth is produced to decrease the density of dislocations locally, the number of dislocations that have been produced in the vertical growth regions and then reached the low-dislocation portions of the lateral growth regions can be reduced significantly. Among other things, since the density of dislocations in the GaN wafer 101 for use in this preferred embodiment has been reduced to $10^7$ cm$^{-2}$ or less, the number of dislocations reaching the low-dislocation portions can be reduced even more significantly. Consequently, the air gaps may be arranged only under the regions where the current confining structure will be formed.

In this manner, the number of unnecessary air gaps is preferably minimized either by eliminating the air gaps entirely from where there is no need to provide the current confining structure or by reducing the areas of the air gaps, if any. By removing those unnecessary air gaps, the degree of close constant between the wafer and the semiconductor multilayer structure can be increased significantly. As a result, when the wafer is cleaved by drawing scribe lines, the number of collapsing air gaps can be reduced and the scribe lines can be drawn uniformly even inside the substrate structure. Consequently, the semiconductor multilayer structure will come off the wafer much less often during the processing steps of polishing and mounting, the wafer can be cleaved more satisfactorily, and the yield can be increased.

In this preferred embodiment and other preferred embodiments to be described later, an n-GaN substrate is used. However, the substrate structure for supporting the semiconductor multilayer structure does not have to be the n-GaN substrate but may also be a structure made of $Al_{x1}Ga_{y1}In_{z1}N$ crystals (where x1+y1+z1=1, x1≧0, y1≧0 and z1≧0). Likewise, the nitride semiconductor layer to be selectively grown laterally on the substrate structure does not have to be the n-GaN layer but may also be an $Al_{x2}Ga_{y2}In_{z2}N$ crystal layer (where x2+y2+z2=1, x2≧0, y2≧0 and z2≧0).

In the preferred embodiment described above, the mask layer 103 covers both the bottom and side surface of each recess. Alternatively, only the bottom of each recess may be covered with the mask layer 103. Also, the mask layer 103 does not have to be made of $SiN_x$ but may also be made of another dielectric material or amorphous insulator. Even by using a mask layer made of $SiO_2$, SiON, $Al_2O_3$, AlON, $TiO_2$, $ZrO_2$ or $Nb_2O_5$, to name a few, the selective lateral growth is also realized.

Figure 12:
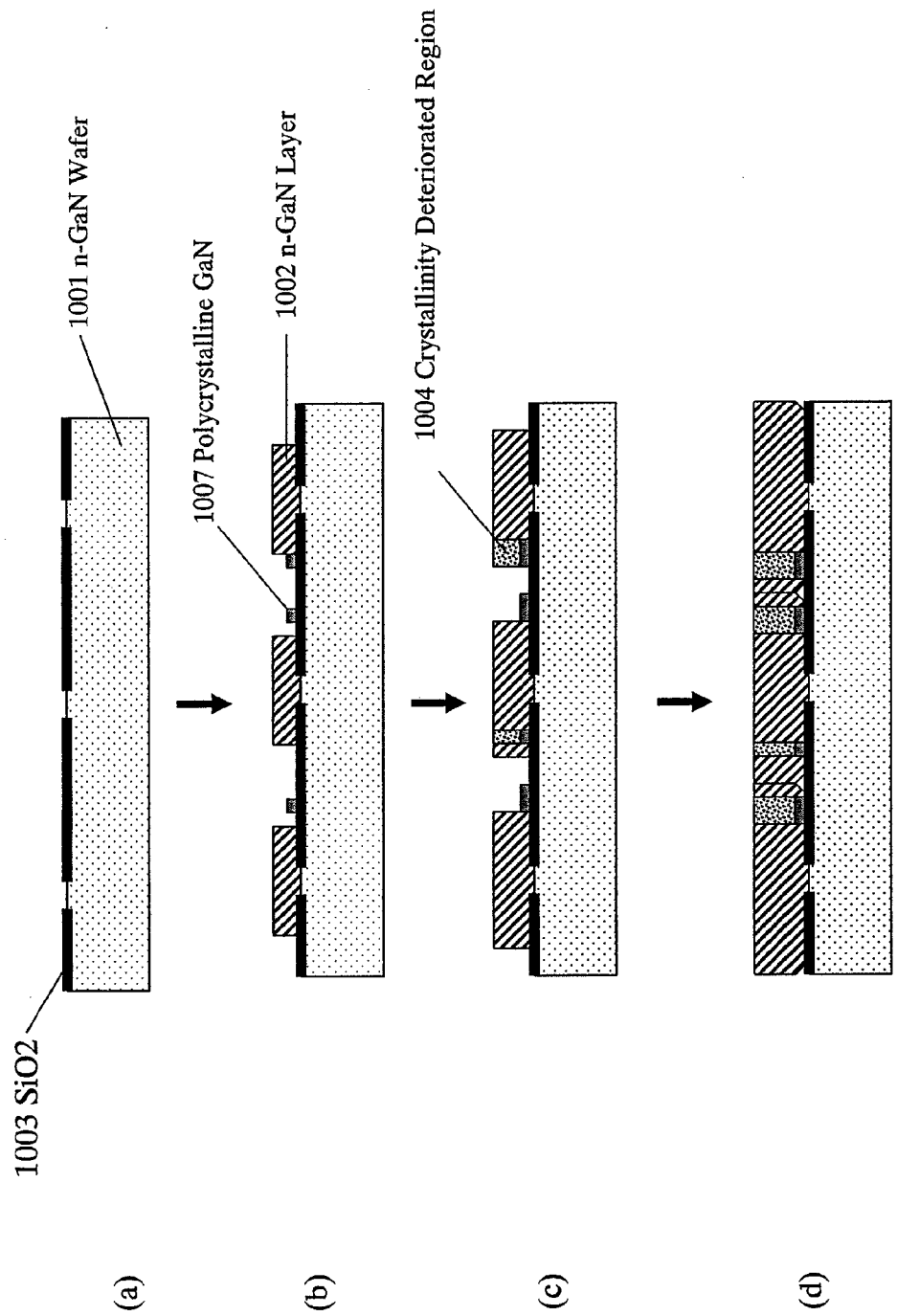
FIGS. 12(a) through 12(d) are cross-sectional views illustrating conventional epitaxial lateral overgrowth process steps.
Figure 13:
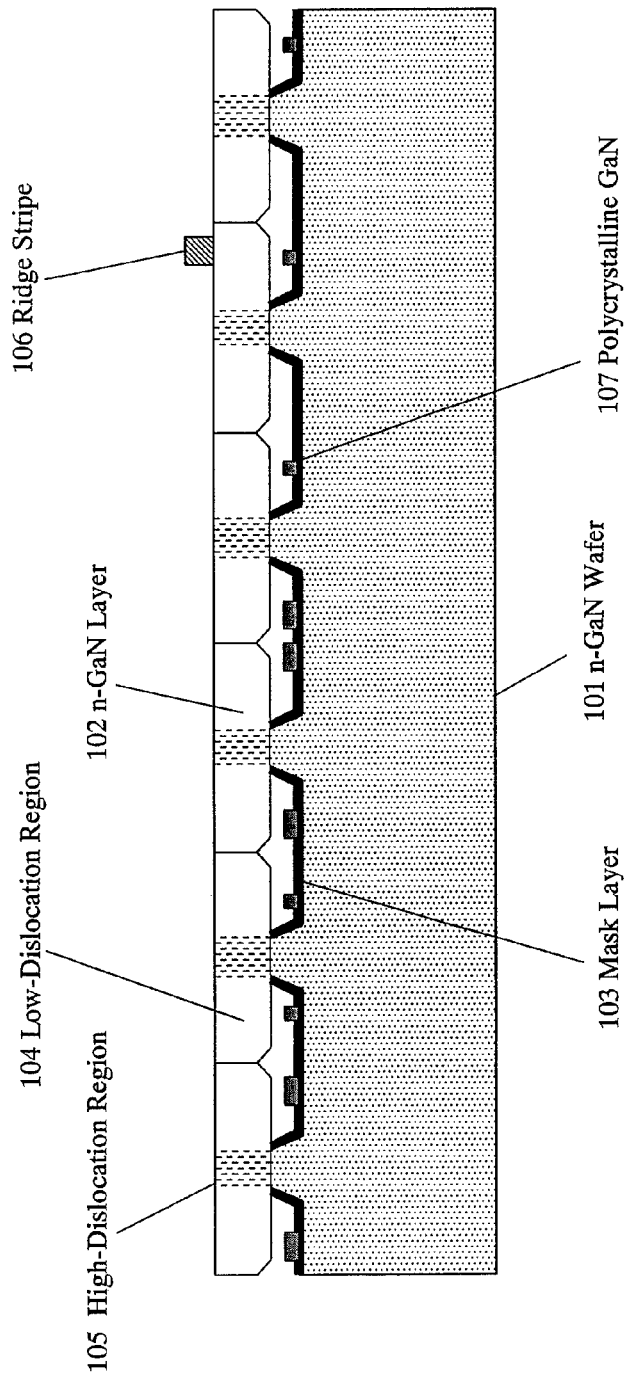
FIG. 13 is a cross-sectional view illustrating a main portion of a conventional semiconductor laser formed by an epitaxial lateral overgrowth process to have air gaps.

It should be noted that even if the bottom of the recess is not covered with the mask layer, the growth of a nitride semiconductor on the bottom of the recess can sometimes be controlled. That is why the bottom of the recess should be, but does not always have to be, covered with the mask layer. Furthermore, the present invention is also effectively applicable to even a situation where a substrate having the conventional structure that has already been described with reference to FIG. 12 is used. That is to say, even when the substrate shown in FIG. 12 is used, the resistance to be produced when current flows across the principal surface of the substrate can also be reduced by setting ΣX/ΣY preferably greater than 1.0, more preferably greater than 2.0, and even more preferably greater than 3.

The same statement will apply to all of the other preferred embodiments to be described later.

Embodiment 2

Hereinafter, a second preferred embodiment of a nitride-based semiconductor device according to the present invention will be described with reference to FIG. 6, which schematically illustrates a cross-sectional structure of a nitride semiconductor laser according to this preferred embodiment.

Figure 6:
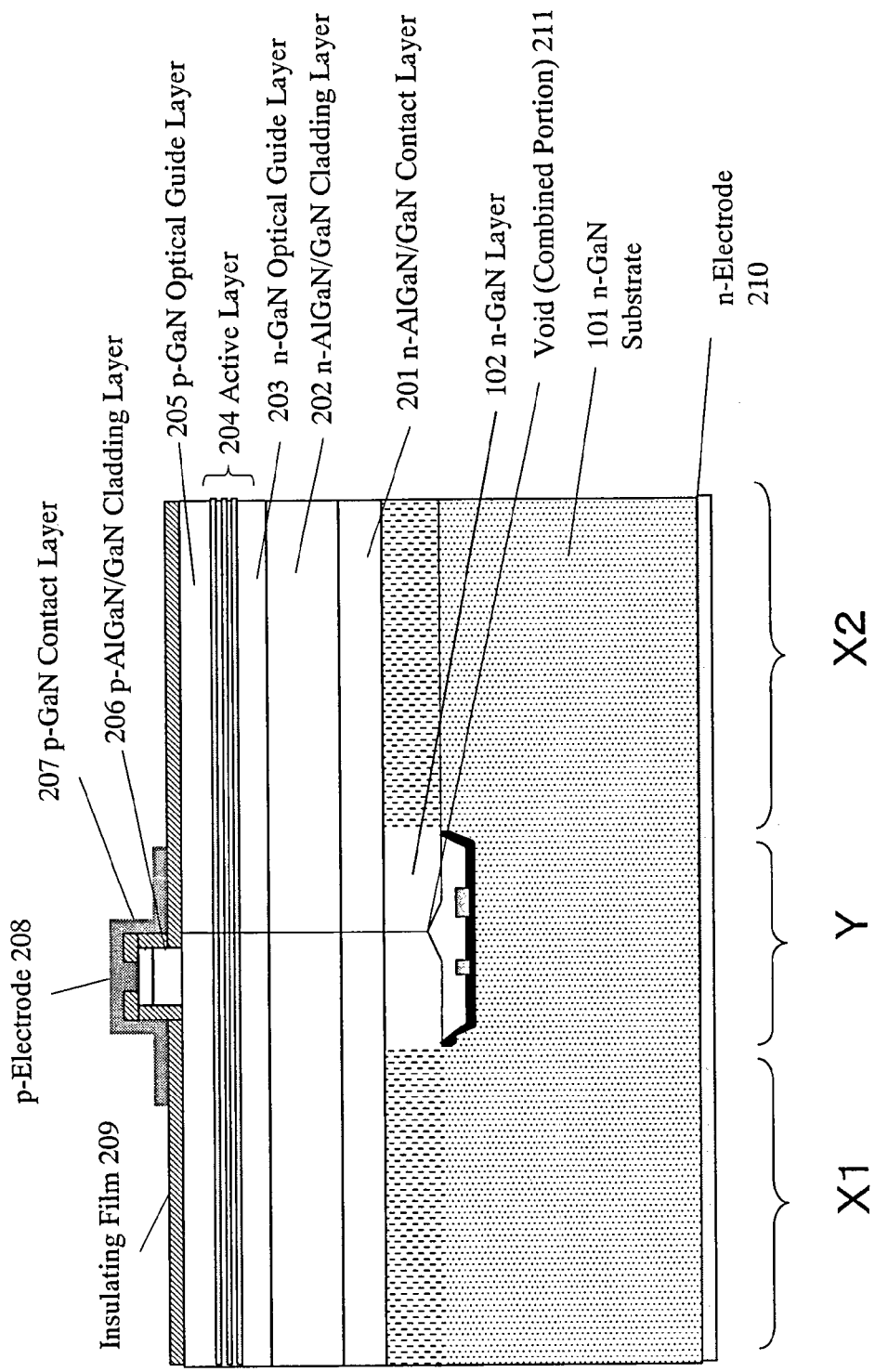
FIG. 6 is a cross-sectional view illustrating a second preferred embodiment of a nitride-based semiconductor device according to the present invention.

The semiconductor laser illustrated in FIG. 6 includes an n-GaN substrate 101 with a striped recess on its principal surface and a semiconductor multilayer structure that has been grown on the GaN substrate 101. The lowermost layer of the semiconductor multilayer structure is an n-GaN layer 102 that has been grown on the n-GaN substrate 101. The n-GaN substrate 101 and the n-GaN layer 102 of this preferred embodiment are made by the same method as the counterparts of the first preferred embodiment described above.

The semiconductor multilayer structure is formed by stacking an n-AlGaN/GaN superlattice contact layer 201, an n-AlGaN/GaN superlattice cladding layer 202, an n-GaN optical guide layer 203, a multiple-quantum well (MQW) active layer 204, a p-GaN optical guide layer 205, a p-AlGaN/GaN cladding layer 206 and a p-GaN contact layer 207 in this order on the n-GaN layer 102. These nitride-based semiconductor layers can be grown effectively by an MOVPE process.

The p-GaN contact layer 207 and the p-AlGaN/GaN cladding layer 206 have been patterned so as to define a ridge stripe, which may have a width (a strip width) of about 2 μm. The top of the semiconductor multilayer structure is covered with an insulating film 209, which has a striped opening over the ridge stripe. Through the opening of the insulating film 209, a portion of the upper surface of the p-GaN contact layer 207 is electrically in contact with a p-electrode 208. An n-electrode 210 is arranged on the back surface of the n-GaN substrate 101.

The shape and location of the ridge stripe (more exactly, the shape and location of the opening of the insulating film 209) define the current (or carrier) injection region of the active layer 204. In this preferred embodiment, the opening of the insulating film 209 is arranged right over the low-dislocation region of the n-GaN layer 102. Therefore, if a predetermined voltage is applied between the p- and n-electrodes 208 and 210, the carriers, injected from the electrodes 208 and 210, will flow selectively through a portion of the MQW active layer 204 that is located right over the recess (i.e., air gap) of the substrate. That portion of the semiconductor multilayer structure, located right over the recess (air gap) on the principal surface of the substrate, has a lower density of dislocations and other defects than the other portions. Also, the ridge stripe is preferably arranged right over the air gap but not just over the void 211 at the combined portion of the n-GaN layer 102. As shown in FIG. 6, there is a dislocation extending straight upward from this void 211.

In the semiconductor laser of this preferred embodiment, when a voltage is applied between the n- and p-electrodes 210 and 208, holes are injected from the p-electrode 208 toward the MQW active layer 204 and electrons are injected from the n-electrode 210 toward the MQW active layer 204. As a result, a gain is produced in the MQW active layer 204 and laser oscillation is produced in a wavelength range in the vicinity of 400 nm. In this preferred embodiment, a single recess is arranged under the current confining structure and $\Sigma X/\Sigma Y$ is defined within the range of 1.0 to 30. More specifically, the sum of the sizes X1 and X2 shown in FIG. 6 is set equal to about 120 μm to about 400 μm and the size Y is set equal to about 20 μm to about 40 μm. Consequently, $\Sigma X/\Sigma Y = (X1+X2)/Y$ falls within the range of 6 to 10. Thus, in this preferred embodiment, the injected current flows vertically at a significantly reduced resistance compared to the conventional one. As a result, the voltage to be applied between the electrodes can be reduced.

In this preferred embodiment, the density of dislocations in the semiconductors right over the air gap is also lower than that of dislocations in the GaN substrate 101 by at least one order of magnitude and the influence of scratches on the principal surface of the GaN substrate 101 can also be reduced significantly.

The nitride-based semiconductor device of the preferred embodiment described above is a semiconductor laser with a current confining structure such as a ridge stripe. However, the present invention is in no way limited to that specific preferred embodiment. Alternatively, the present invention may also be applied to a light-emitting diode (LED) that needs no current confining structure. Even in an LED, by reducing the size of the air gap (recess), the electrical resistance can also be reduced overall when current is made to flow across the principal surface of its substrate.

Figure 7:
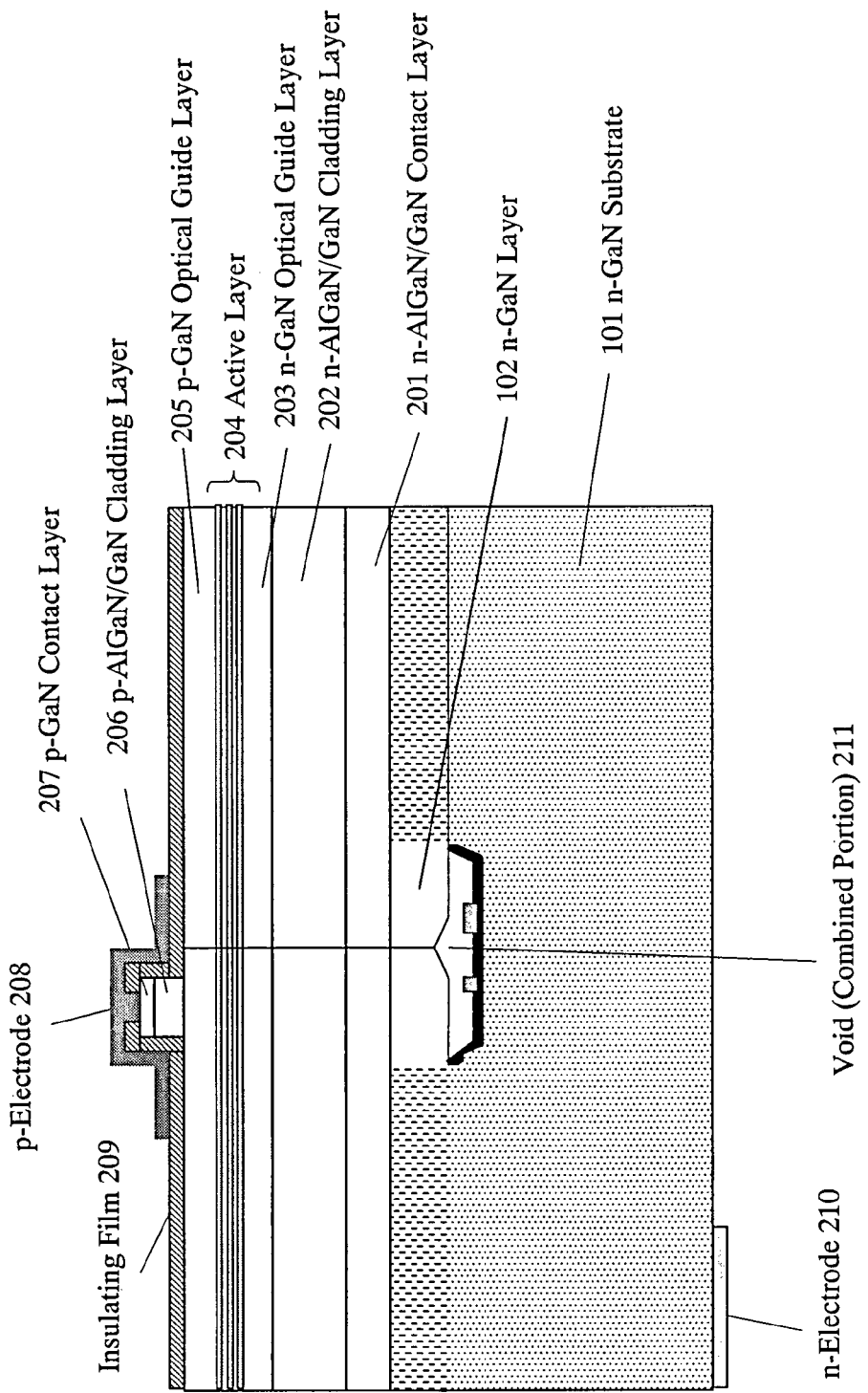
FIG. 7 is a cross-sectional view illustrating a modified example of the semiconductor device shown in FIG. 6.

In the semiconductor laser of this preferred embodiment, the p- and n-electrodes 208 and 210 are arranged on the opposite sides of the substrate 101 as shown in FIG. 6. Alternatively, the p- and n-electrodes 208 and 210 may be arranged on the same side (i.e., on the principal surface) of the substrate 101. According to the conventional ELO process, a thick film needs to be formed to reduce the electrical resistance with respect to current flowing parallel to the principal surface of the substrate. However, according to the present invention, the area of the air gap portion can be reduced and therefore the electrical resistance with respect to the laterally flowing current can also be reduced overall. As a result, the long crystal growth process, which had to be carried out to form the thick film, can be shortened, thus increasing the throughput of the manufacturing process. It should be noted that even when arranged on the back surface of the substrate 101, the n-electrode does not have to cover the back surface entirely but may cover the back surface only partially as shown in FIG. 7.

There is a void at the combined portion 211 of the n-GaN layer 102 that has grown laterally and dislocations are easily produced in the vicinity of the combined portion 211. Even in the n-GaN layer 102, leakage current is easily generated at and around the combined portion 211. That is why to reduce the threshold current of the semiconductor laser and increase the long-term reliability thereof, a structure that prevents current from flowing through the combined portion 211 is preferably adopted. In the example illustrated in FIG. 7, the n-electrode 210 and the current confining structure such as a ridge stripe are arranged on the same side with respect to the combined portion 211. By adopting such an arrangement, it is possible to prevent the current path from crossing the dislocations that are present around the combined portion 211.

Embodiment 3

Figure 8:
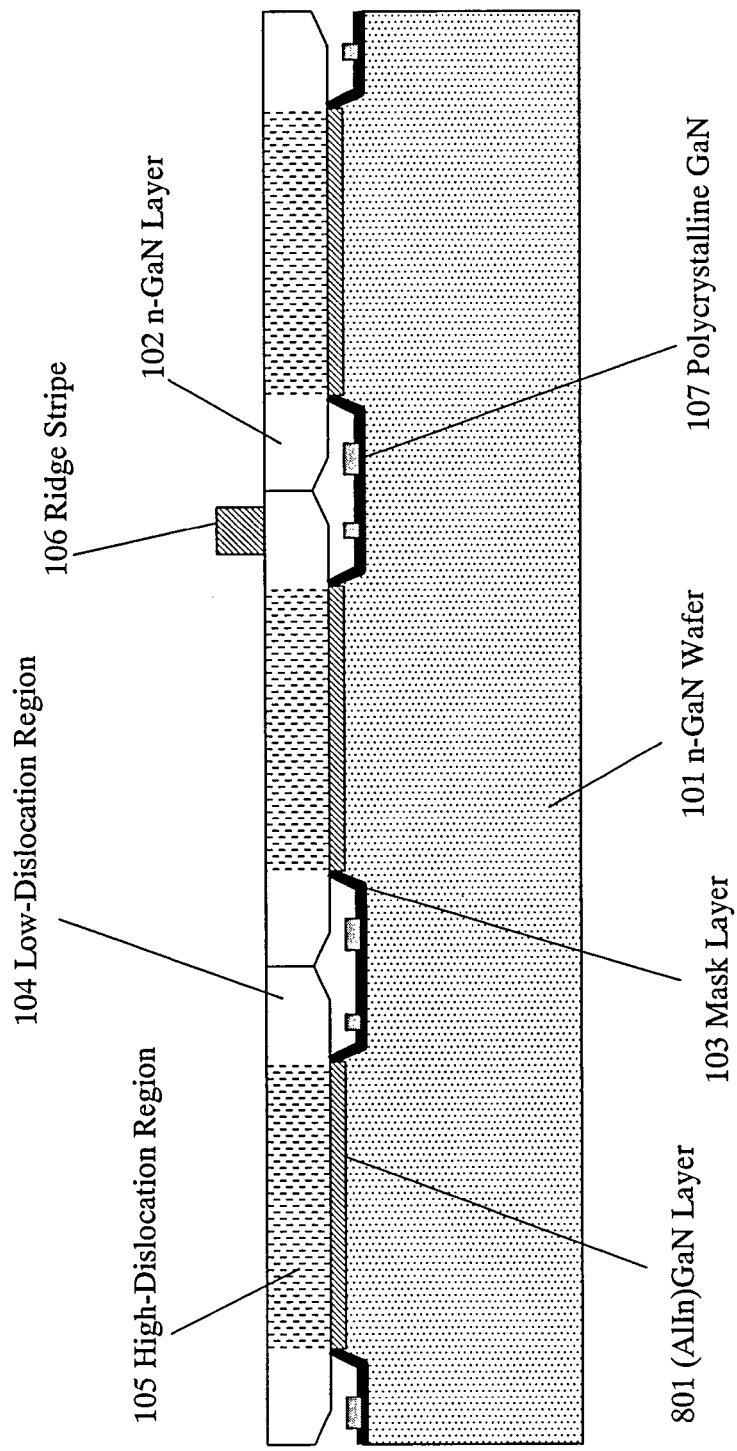
FIG. 8 is a cross-sectional view illustrating a third preferred embodiment of a nitride-based semiconductor device according to the present invention.

Hereinafter, a third preferred embodiment of a nitride-based semiconductor device according to the present invention will be described with reference to FIG. 8.

The arrangement of this preferred embodiment is different from that shown in FIG. 1 in that a GaN layer 801 (with a thickness of 1 μm) is further provided on the surface of the n-GaN substrate 101 according to this preferred embodiment. Specifically, after the GaN layer 801 has been grown on the principal surface of the n-GaN wafer 101, a striped ridge is formed on the principal surface of the wafer by the method that has already been described for the first preferred embodiment.

In this preferred embodiment, the ridge portion (corresponding to a raised portion of the resist) has a width X of about 20 μm and the recess has a width Y of about 5 μm. The bottom and side surface of the recess are covered with a mask layer 103 of $SiO_2$ that has been deposited by ECR sputtering process or thermal CVD process.

The n-GaN layer 102 is also selectively grown laterally by the same method as that already described for the first preferred embodiment. In this preferred embodiment, $\Sigma X/\Sigma Y$ is defined approximately equal to eight.

Hereinafter, it will be described how the GaN layer 801 on the n-GaN wafer 101 works.

As described above, the principal surface of the n-GaN wafer 101 has scratches, damage and so on that were made during the polishing process. However, the principal surface of the GaN wafer has not only such surface damages that were caused by the polishing process but also variations in crystallographic orientations that were caused while the GaN wafer itself was made. For that reason, if a GaN layer were epitaxially grown directly on such a GaN wafer, the resultant GaN layer might have a decreased degree of surface planarity or morphology. To avoid those unwanted effects caused by the state of the principal surface of the wafer, a buffer layer such as the GaN layer 801 is preferably inserted between the GaN wafer 101 and the n-GaN layer 102.

By inserting such a buffer layer, the degree of unevenness on the uppermost surface of the substrate structure can be reduced and the degree of planarity of its crystal faces can be increased. In addition, the unwanted effects that could be caused by the variations in crystallographic orientations on the principal surface of the GaN wafer can also be reduced.

Figure 9:
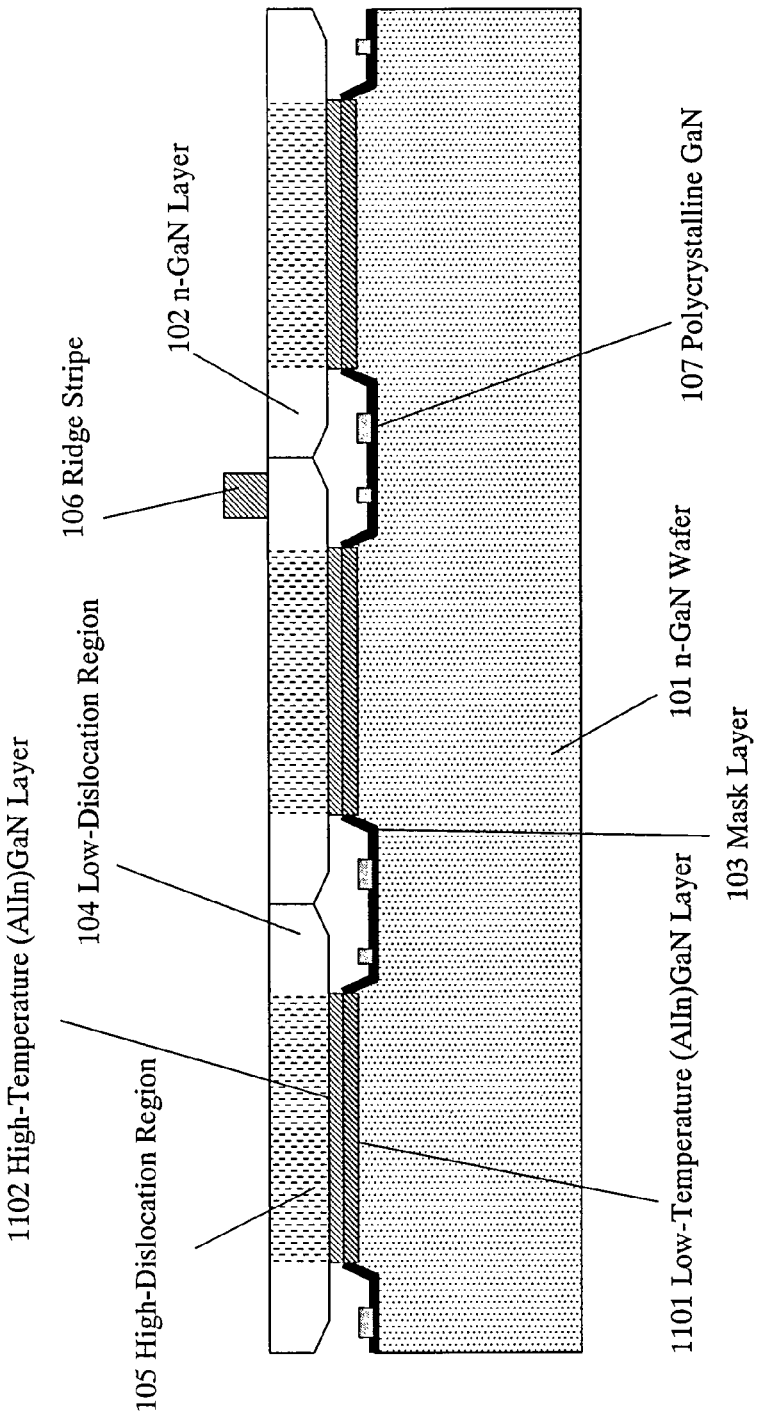
FIG. 9 is a cross-sectional view illustrating a modified example of the semiconductor device shown in FIG. 8.

The GaN layer 801 may have a multilayer structure. FIG. 9 illustrates a structure in which a low-temperature GaN layer 1101 has been grown at a temperature of about 500° C. to about 600° C. on the n-GaN wafer 101 and then a high-temperature GaN layer 1102 has been grown thereon at a temperature of about 1,000° C. to about 1,100° C. By growing the low-temperature GaN layer 1101, the effects that could be caused by the defects in the n-GaN wafer 101 can be minimized. In addition, the degree of crystallinity can be increased by the high-temperature GaN layer 1102. As a result, the density of defects in the n-GaN layer 102 that has grown on the high-temperature GaN layer 1102 can be further reduced.

Figure 10:
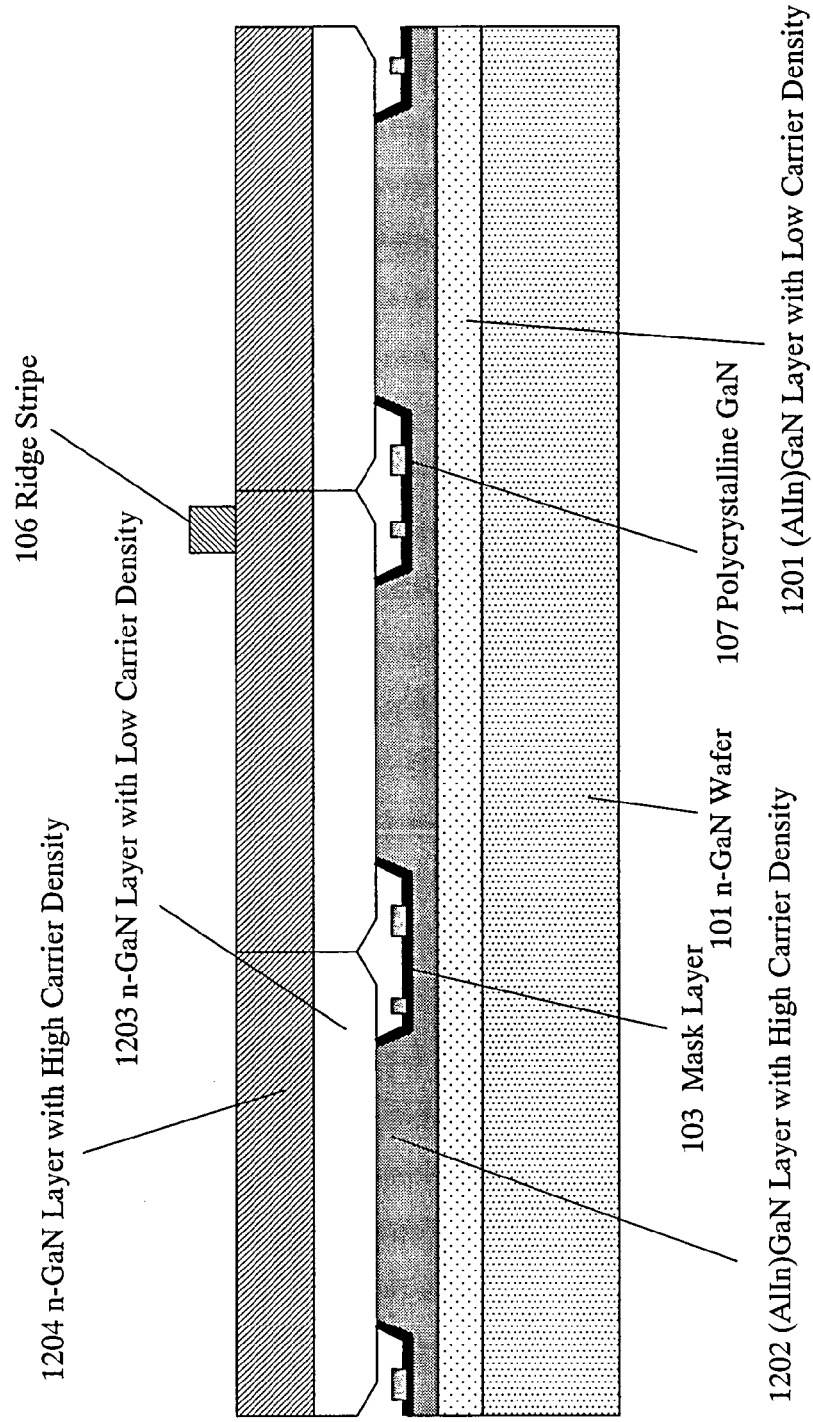
FIG. 10 is a cross-sectional view illustrating another modified example of the semiconductor device shown in FIG. 8.

FIG. 10 illustrates a structure in which a GaN layer having non-uniform dopant concentrations or carrier densities in the thickness direction has been formed on the GaN wafer 101. Specifically, on the GaN wafer 101, stacked are an (AlIn)GaN layer 1201 having a relatively low carrier density of about $5\times10^{17}$ cm$^{-3}$ and an (AlIn)GaN layer 1202 having a relatively high carrier density of about $1\times10^{17}$ cm$^{-3}$. As used herein, the "(AlIn)GaN layer" refers to a GaN layer and a nitride-based semiconductor layer in which at least a portion of Ga in the GaN layer has been replaced with Al or In.

In this preferred embodiment, only the (AlIn)GaN layer 1202 having the relatively high carrier density has the recesses. Alternatively, the bottom of the recesses may reach the (AlIn)GaN layer 1201 having the relatively low carrier density.

The n-GaN layer 102 may be grown by the same method as that already described for the first preferred embodiment.

If the (AlIn)GaN layer 1201 having the relatively high carrier density were grown directly on the principal surface of the GaN wafer 101, then dislocations would be produced in GaN crystals having the high carrier density and its degree of crystallinity would decrease. For that reason, during the initial stage of growth of (AlIn)GaN crystals on the principal surface of the GaN wafer 101, the crystals are preferably grown under such conditions as to make the carrier density as low as possible.

In the example illustrated in FIG. 10, the GaN layer 1201 having the relatively low carrier density is formed on the GaN wafer 101 first. However, since the ridge portion with the narrow stripe width has a high carrier density, the electrical resistance has also been reduced sufficiently.

The exposed surface of the (AlIn)GaN layer 1202 having the relatively high carrier density functions as the seed portions, from which the n-GaN layer 102 grows not only vertically but also laterally as well. The n-GaN layer 102 does not have to have a uniform carrier density but may have a distribution, too. For example, a GaN layer 1203 having a relatively low carrier density of $5\times10^{17}$ cm$^{-3}$ or less may be formed during an initial stage of the growth process and then a GaN layer 1204 having a relatively high carrier density of about $5\times10^{17}$ cm$^{-3}$ may be stacked thereon.

The (AlIn)GaN layer 1202 having the relatively high carrier density preferably has a thickness of 50 nm to 500 nm, while the GaN layer 1203 having the relatively low carrier density preferably has a thickness of 50 nm to 1,000 nm.

The buffer layer to be inserted between the n-GaN layer 102 and the GaN substrate 101 does not have to be a GaN layer but may also be made of a material represented by $Al_{x3}Ga_{y3}In_{z3}N$ (where $x3+y3+z3=1$, $x3 \geq 0$, $y3 \geq 0$ and $z3 \geq 0$).

A substrate with such a buffer layer and a substrate with no buffer layer will be collectively referred to herein as "substrate structures". That is to say, the "substrate structure" may refer to only a substrate body made of $Al_{x1}Ga_{y1}In_{z1}N$ crystals (where $x1+y1+z1=1$, $x1 \geq 0$, $y1 \geq 0$ and $z1 \geq 0$) or a structure including an $Al_{x3}Ga_{y3}In_{z3}N$ crystal layer (where $x3+y3+z3=1$, $x3 \geq 0$, $y3 \geq 0$ and $z3 \geq 0$) on the upper surface of such a substrate body. If the $Al_{x3}Ga_{y3}In_{z3}N$ crystal layer (where $x3+y3+z3=1$, $x3>0$, $y3 \geq 0$ and $z3 \geq 0$) has been formed on the uppermost surface of such a substrate body, then a particular region on the surface of this crystal layer will function as a "vertical growth region".

Embodiment 4

Hereinafter, a fourth preferred embodiment of a nitride-based semiconductor device according to the present invention will be described with reference to FIG. 11.

Figure 11:
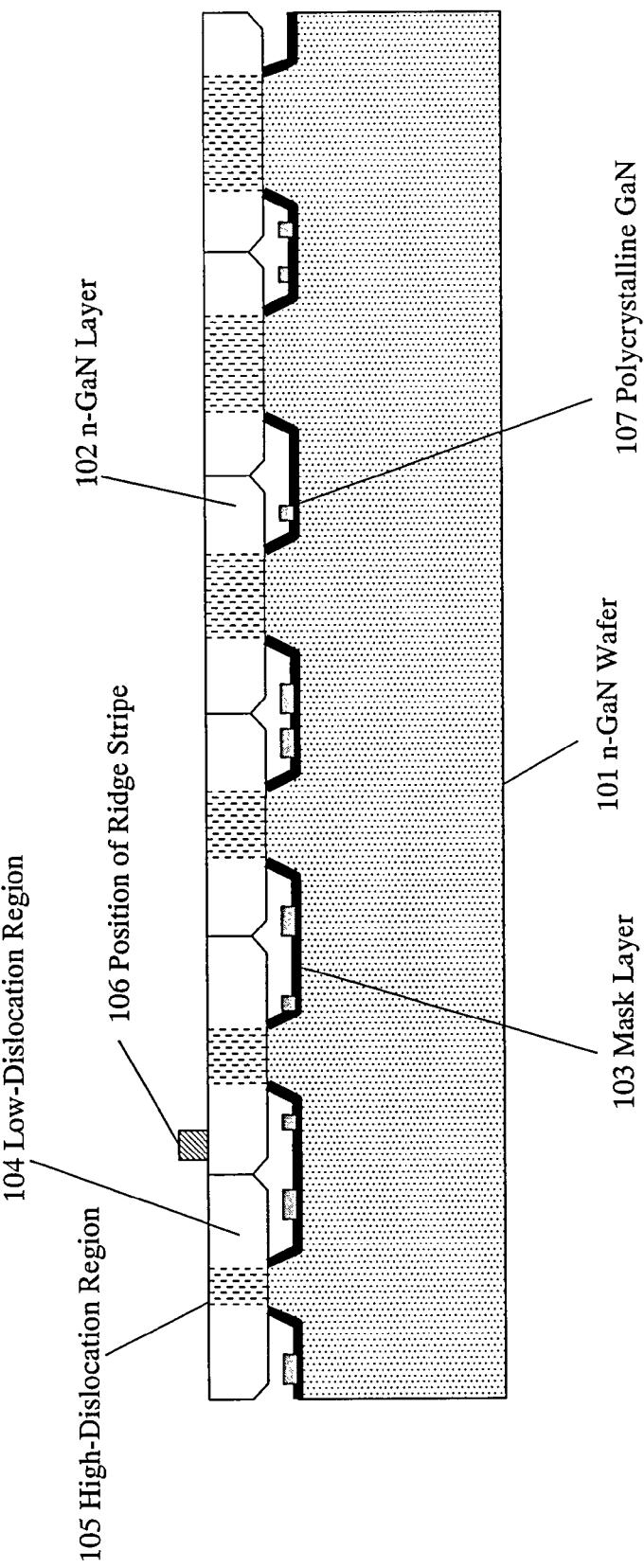
FIG. 11 is a cross-sectional view illustrating a fourth preferred embodiment of a nitride-based semiconductor device according to the present invention.

In the example illustrated in FIG. 11, each of multiple recesses on the principal surface of the GaN wafer 101 has a width of about 5 μm but the widths of the ridge portions (raised portions) change from one position to another. That is to say, the widths of the ridge portions are relatively small near the outer periphery of the wafer but gradually increase toward the center of the wafer. In the other respects, the arrangement shown in FIG. 11 is the same as that of the first preferred embodiment that has already been described with reference to FIG. 1.

By adopting such an arrangement, not only can the density of dislocations in the GaN wafer 101 be reduced by at least one order of magnitude but also can be the warp of the wafer due to a difference in lattice constant between the wafer and the semiconductor multilayer structure be reduced as well.

In general, if an n-GaN wafer 101 is heated to a crystal growing temperature of 1,000° C. to 1,100° C. and then cooled to room temperature, the wafer will usually be warped due to a difference in lattice constant between the wafer and the semiconductor multilayer structure. The warp direction of the wafer changes depending on whether the lattice constant of the semiconductor multilayer structure is smaller than that of the GaN wafer 101 or greater than it.

If the lattice constant of the semiconductor multilayer structure is greater than that of the GaN wafer 101, the ridge portions preferably have variable widths that decrease toward the outer periphery of the wafer. This is because the stress on the periphery of the wafer can be reduced by doing so. On the other hand, if the lattice constant of the semiconductor multilayer structure is smaller than that of the GaN wafer 101, the ridge portions preferably have variable widths that increase toward the outer periphery of the wafer. In that case, X/Y may be set approximately equal to 0.5 at the center of the wafer and approximately equal to 2.0 on the periphery of the wafer, respectively.

Alternatively, similar effects are achievable even by making the widths of the ridge portions (i.e., raised portions) constant irrespective of the position and changing the widths of the recesses from one position on the wafer to another. However, if the widths of the recesses were increased excessively, then the crystal growing process needed to combine the n-GaN layer 102 might be too long to finish. That is why the widths are preferably adjusted within an appropriate range. In that case, X/Y may be set approximately equal to 0.5 at the center of the wafer and approximately equal to 1.0 on the periphery of the wafer, respectively.

INDUSTRIAL APPLICABILITY

A nitride-based semiconductor device according to the present invention can be used effectively as a light source for an optical recorder, an optical display (laser display) device and so on that need a highly reliable GaN based semiconductor laser. The present invention is also effectively applicable for use in laser cutting, medical treatments, and so on. Furthermore, if the present invention is applied to another nitride-based semiconductor device including an active region such as a channel region, then the channel can have a much smaller number of defects. As a result, a high-reliability device is realized.

The invention claimed is:

1. A nitride-based semiconductor device comprising: a substrate structure with electrical conductivity; and a semiconductor multilayer structure that is supported on the substrate structure, wherein the principal surface of the substrate structure has at least one vertical growth region, which functions as a seed crystal for growing a nitride-based semiconductor vertically, and a plurality of lateral growth regions for allowing the nitride-based semiconductor that has grown on the vertical growth region to grow laterally, and wherein the sum $\Sigma X$ of the respective sizes of the vertical growth regions as measured in a first direction, which is parallel to the principal surface of the substrate structure, and the sum $\Sigma Y$ of the respective sizes of the lateral growth regions as measured in the first direction satisfy the inequality $\Sigma X/\Sigma Y > 1.0$, wherein the vertical and lateral growth regions on the principal surface of the substrate structure extend in stripes perpendicularly to the first direction, and wherein the vertical growth region on the principal surface of the substrate structure is defined by a striped ridge portion that is present on the principal surface of the substrate structure.

2. The nitride-based semiconductor device of claim 1, wherein the substrate structure is made of $Al_{x1}Ga_{y1}In_{z1}N$ crystals (where $x1+y1+z1=1$, $x1 \geqq 0$, $y1 \geqq 0$ and $z1 \geqq 0$), and wherein the semiconductor multilayer structure includes an $Al_{x2}Ga_{y2}In_{z2}N$ crystal layer (where $x2+y2+z2=1$, $x2 \geqq 0$, $y2 \geqq 0$ and $z2 \geqq 0$) that has grown from the vertical growth region on the principal surface of the substrate structure.

3. The nitride-based semiconductor device of claim 2, wherein the semiconductor multilayer structure includes an active layer, of which the bandgap is smaller than that of the $Al_{x2}Ga_{y2}In_{z2}N$ crystal layer, and wherein the device further includes a current confining structure for injecting carriers into a part of the active layer.

4. The nitride-based semiconductor device of claim 3, wherein the current confining structure is located right over the lateral growth regions on the principal surface of the substrate structure.

5. The nitride-based semiconductor device of claim 1, wherein the substrate structure includes:

a substrate body made of $Al_{x1}Ga_{y1}In_{z1}N$ crystals (where $x1+y1+z1=1$, $x1 \geqq 0$, $y1 \geqq 0$ and $z1 \geqq 0$); and an $Al_{x3}Ga_{y3}In_{z3}N$ crystal layer (where $x3+y3+z3=1$, $x3 \geqq 0$, $y3 \geqq 0$ and $z3 \geqq 0$), which has been formed on the upper surface of the substrate body and of which the surface functions as the principal surface of the substrate structure, and wherein the semiconductor multilayer structure includes an $Al_{x1}Ga_{y1}In_{z1}N$ crystal layer (where $x2+y2+z2=1$, $x2 \geqq 0$, $y2 \geqq 0$ and $z2 \geqq 0$) that has grown from the vertical growth region on the principal surface of the substrate structure.

6. The nitride-based semiconductor device of claim 5, wherein the $Al_{x3}Ga_{y3}In_{z3}N$ layer has a structure in which at least one of the mole fractions x3, y3 and z3 of its constituents changes in the thickness direction thereof.

7. The nitride-based semiconductor device of claim 6, wherein the $Al_{x3}Ga_{y3}In_{z3}N$ layer includes at least two layers.

8. The nitride-based semiconductor device of claim 1, further comprising a mask layer that covers the principal surface of the substrate structure, wherein the mask layer includes a striped opening, which is aligned with the vertical growth region, and masking portions, which are aligned with the lateral growth regions.

9. The nitride-based semiconductor device of claim 8, wherein the area of the opening of the mask layer is greater than the overall area of the masking portions of the mask layer.

* * * * *

UNITED STATES PATENT AND TRADEMARK OFFICE
CERTIFICATE OF CORRECTION

| | | |
|---|---|---|
| PATENT NO. | : 7,704,860 B2 | Page 1 of 1 |
| APPLICATION NO. | : 10/597575 | |
| DATED | : April 27, 2010 | |
| INVENTOR(S) | : Toshitaka Shimamoto et al. | |

It is certified that error appears in the above-identified patent and that said Letters Patent is hereby corrected as shown below:

Title Page, Item (30) should be added as follows:

-- (30) Foreign Application Priority Data Nov. 22, 2004 (JP) 2004-337218 --.

Signed and Sealed this

Fifth Day of October, 2010

David J. Kappos
*Director of the United States Patent and Trademark Office*